US008422287B2

(12) United States Patent
Min et al.

(10) Patent No.: US 8,422,287 B2
(45) Date of Patent: Apr. 16, 2013

(54) PULSE FIELD ASSISTED SPIN MOMENTUM TRANSFER MRAM DESIGN (75) Inventors: Tai Min, San Jose, CA (US); Qiang Chen, Livermore, CA (US); Po Kang Wang, Los Altos, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 104 days.

(21) Appl. No.: 12/807,611

(22) Filed: Sep. 9, 2010

(65) Prior Publication Data

US 2012/0063214 A1    Mar. 15, 2012

(51) Int. Cl.
G11C 11/14    (2006.01)

(52) U.S. Cl.
USPC ........... 365/172; 365/148; 365/158; 365/171; 977/933; 977/935

(58) Field of Classification Search ........... 365/48, 365/55, 62, 66, 74, 78, 80–93, 100, 130, 365/131, 148, 158, 171–173, 225.5, 243.5; 257/421, E21.665; 438/3; 977/933–935
See application file for complete search history.

(56) References Cited

U.S. PATENT DOCUMENTS

| | | | |
|---|---|---|---|
| 6,130,814 A | 10/2000 | Sun | |
| 6,798,690 B1 | 9/2004 | Katti | |
| 6,798,691 B1 | 9/2004 | Ounadjela et al. | |
| 7,239,541 B2 | 7/2007 | Saito et al. | |
| 7,248,497 B2 | 7/2007 | Saito et al. | |
| 7,394,684 B2 | 7/2008 | Inokuchi et al. | |
| 7,511,991 B2 | 3/2009 | Saito et al. | |
| 7,518,906 B2 | 4/2009 | Ikegawa et al. | |
| 7,577,021 B2 * | 8/2009 | Guo et al. | 365/158 |
| 7,599,156 B2 | 10/2009 | Kishi et al. | |
| 7,715,224 B2 | 5/2010 | Min et al. | |
| 7,821,086 B2 * | 10/2010 | Kajiyama | 257/421 |
| 7,838,953 B2 * | 11/2010 | Ohno et al. | 257/421 |
| 7,885,105 B2 * | 2/2011 | Li et al. | 365/173 |
| 7,929,342 B2 * | 4/2011 | Numata et al. | 365/171 |
| 7,936,596 B2 * | 5/2011 | Li | 365/173 |
| 7,944,736 B2 * | 5/2011 | Dieny et al. | 365/158 |
| 8,004,881 B2 * | 8/2011 | Zhu et al. | 365/158 |
| 2008/0105938 A1 * | 5/2008 | Ohno et al. | 257/421 |
| 2009/0135526 A1 * | 5/2009 | Dieny et al. | 360/314 |
| 2010/0128518 A1 | 5/2010 | Min | |

OTHER PUBLICATIONS

"Spin-current interaction with a monodomain magnetic body: A model study," by J. Z. Sun, Physical Review B, vol. 62, No. 1, Jul. 1, 2000-I, 2000 The American Physical Society, pp. 570-578.

(Continued)

*Primary Examiner* — Harry W Byrne
(74) *Attorney, Agent, or Firm* — Saile Ackerman LLC; Stephen B. Ackerman (57) ABSTRACT

An MRAM array structure and a method of its operation that is not subject to accidental writing on half-selected elements. Each element of the MRAM is an MTJ (magnetic tunneling junction) cell operating in accord with an STT (spin torque transfer) scheme for changing its free layer magnetization state and each cell is patterned to have a C-shape in the horizontal plane. The cell thereby operates by C-mode switching to provide stability against accidental writing by half-selection. During operation, switching of a cell's magnetization is accomplished with the assist of the pulsed magnetic fields of additional word lines that are formed either orthogonal to or parallel to the existing bit lines and that can carry currents in either direction as required to provide the assist.

11 Claims, 4 Drawing Sheets

OTHER PUBLICATIONS

"Switching field variation in patterned submicron magnetic film elements," by Youfeng Zheng and Jian-Gang Zhu, Journal of Applied Physics, vol. 81, No. 8, Apr. 15, 1997, 1997 American Institute of Physics, pp. 5471-5473.

"Current-driven excitation of magnetic multilayers," by J. C. Slonczewski, Journal of Magnetism and Magnetic Materials, 159 (1996), L1-L7, Ellsevier.

* cited by examiner

PULSE FIELD ASSISTED SPIN MOMENTUM TRANSFER MRAM DESIGN

BACKGROUND OF THE INVENTION

1. Field of the Invention

This invention relates generally to a spin torque transfer (STT) magnetic random access memory (STT-MRAM) cell formed in a magnetic tunneling junction (MTJ) configuration and patterned in a C-shape. In particular, it relates to the use of an additional word line to provide a pulsed magnetic field that assists in switching the magnetization of such a cell.

2. Description of the Related Art

The conventional magnetic tunneling junction (MTJ) device is a form of ultra-high magnetoresistive (MR) device in which the relative orientation of the magnetic moments of parallel, vertically separated magnetized layers, controls the flow of spin-polarized electrons tunneling through a very thin dielectric layer (the tunneling barrier layer) formed between those layers.

Figure 1:
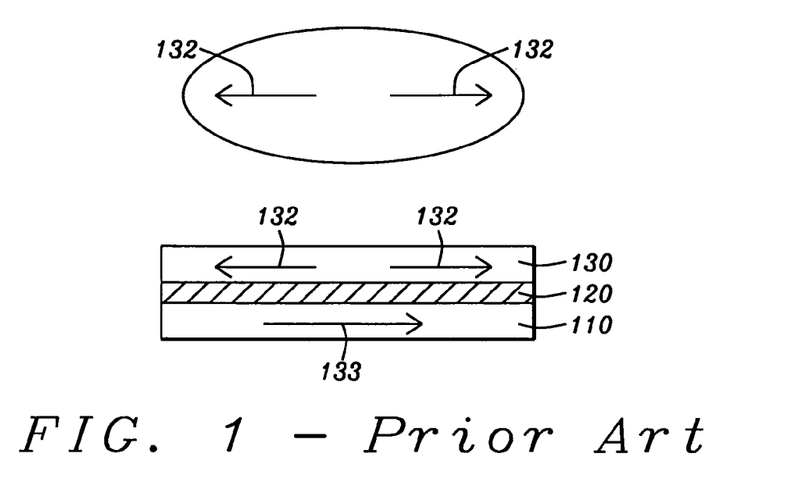
FIG. 1 is a schematic representation of an exemplary elliptical cross-section prior art MTJ cell.

Referring to FIG. 1 there is shown a highly schematic illustration of a prior art MTJ cell that, for the purposes of the following descriptions, can be either a standard MTJ cell or, as will be discussed below, a spin torque transfer (STT) cell. Although the physics of the two types of cell operation are quite different, the cell structures have striking similarities. The figure includes an overhead view of the cell, showing it to have an elliptical horizontal cross-sectional shape. Beneath the elliptical overhead view, the cell is shown in vertical cross-section, revealing three "active" layers, all of which play a role in providing its physical properties.

The three active layers include: a fixed layer (110) formed of magnetic material, a tunnel barrier layer (120) formed of dielectric material and a free layer (130), also formed of magnetic material. Arrows (132) represent the two possible directions of the magnetic moments of the free layer and arrow (133) represents the single magnetization direction of the fixed layer. In the case of the standard MTJ cell, the magnetic moment of the free layer is made to move from one direction to the other under the action of the external magnetic fields of nearby current carrying wires.

In the case of the STT type of MTJ cell, to be described in greater detail below, the free layer magnetic moment is made to move by the action of electron torques produced by currents passing through the cell rather than by the magnetic fields of current carrying wires that are external to the cell. In either case, the magnetization of the fixed (or pinned) layer is held in place by an interaction with a neighboring layer (the pinning layer) that is not specifically shown here. Because the magnetization of the free layer must be relatively free to move under whichever of the mechanisms applied, there must be a mechanism to stabilize the direction of its magnetic moment after it has been moved to a desired orientation and the moving force has been removed. This is particularly true in the case of increasingly small cells, where random thermal destabilizing effects can be comparable to the intentional effects used to switch the moment directions.

One way of stabilizing such an MTJ cell is to provide it with a shape anisotropy by patterning it with, for example, an elliptical cross-section as shown in FIG. 1. This cell shape tends to stabilize the magnetization along either direction of the longer elliptical axis, called the easy axis, so that a certain minimum field or torque is required to change the magnetization from one direction to the other.

Figure 2:
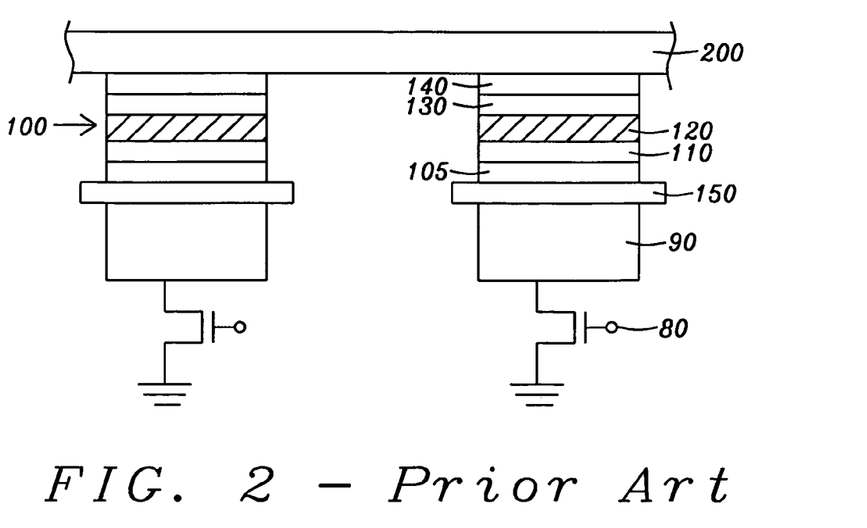
FIG. 2 is a schematic illustration of a vertical cross-sectional view of two adjacent MTJ cells formed in a STT configuration and positioned according to the prior art between a common word line and bit lines.

Referring to FIG. 2, there is shown a more detailed, yet still schematic illustration of a vertical cross-sectional view of two adjacent MTJ cells (100) formed in a STT configuration. Each cell is positioned beneath a common current carrying line (200), the bit line. Going vertically downward in either cell, there is first shown a capping layer (140) contacting the bit line and protecting the cell, beneath the capping layer there is shown a magnetically free layer (130) whose magnetic moment is free to move, beneath the free layer there is shown a dielectric tunneling barrier layer (120), beneath the tunneling barrier layer there is shown a pinned layer (110) of fixed magnetic moment, beneath the pinned layer there is shown a seed layer (105), on which is deposited the pinned layer, below the seed layer is shown a bottom electrode (150), which makes electrical contact with the cell, beneath the bottom electrode there is shown a cross-section of a stud (90) that facilitates connection to an accessing transistor (80) and, finally, there is shown a schematic circuit of such an accessing transistor (80), connected to ground, that allows a current between the bit line and ground through either of the MTJ cells, if they are selected.

The switching of the free layer (130) magnetization can be achieved by using the STT mechanism, as described by J. C. Slonczewski, "Current-driven excitation of magnetic multilayers," J. Magn. Magn. Mater., vol. 159, pp. L1-L7, 1996, J. Sun, "Spin-current interaction with a monodomain magnetic body: A model study," Phys. Rev. B 62, 570 (2000) and as further disclosed by Sun, (U.S. Pat. No. 6,130,814). In the STT design, the direction of the current through the free layer (130) will determine whether its magnetization is parallel to (P) or anti-parallel to (AP) the magnetization of the pinned layer (110). To change the direction of free layer magnetization (i.e., to "write" on the free layer) from AP to P, the electrons (current) must move from the pinned layer (free layer) to the free (pinned) layer. After passing through the pinned layer, the spin direction of the majority of electrons in the current will have the same direction as the magnetic moment of the pinned layer. This is a result of the torque exerted on the spinning electron by the predominant magnetic moment of the pinned layer. The electrons then pass through the dielectric barrier layer (120), which preserves their spin direction. Since the free layer's magnetic moment is opposite to that of the pinned layer, the majority of the electron's spins will be opposite to that of the free layer and will interact with the magnetization of the free layer near the interface between the free layer and the dielectric barrier layer. Through this interaction, the spin of the transmitted electrons will be transferred to the free layer. When the electron current exceeds a critical value, $I_c$, there will be sufficient momentum transfer from the current to the free layer to switch the magnetization direction of the free layer from the AP state to the P state. To write from P to AP, on the other hand, the electrons must flow in the opposite direction, from the free layer to the pinned layer. After being transmitted through the free layer, the majority of the electrons will have their spins directed along the magnetization direction (P) of the free layer and the pinned layer as well. They can therefore, be transported through the pinned layer with very little scattering. The minority of the electrons, with their spins opposite to the magnetization of the free and pinned layers, will be reflected back to the free layer by the pinned layer and will transfer their polarizations to the free layer at that interface between the barrier layer and the free layer. Once the number of minority electrons in the current is sufficient, the magnetization of the free layer can be switched to the AP state.

For practical applications to high density memory circuits, the critical current should be low. The current is provided by the transistor connected to the MTJ element and the transistor's size determines the density of the memory. Also, an MTJ element with a dielectric spacer (tunneling barrier) layer such as MgO is the preferred choice due to the fact that it can provide a magnetoresistive ratio, DR/R, up to 600%, which is critical for memory read signal and speed. To avoid dielectric breakdown of the MTJ, the voltage, $V_c$, across the dielectric layer at the critical current, $I_c$, which is given by: $V_c=RI_c$, has to be lower than the breakdown voltage of the barrier layer. This means that the low critical current (or current density, $J_c$) is essential for the MRAM product.

Numerous efforts have been made trying to reduce the critical current or current density. According to J. Sun, cited above, $J_c$ is proportional to $(\alpha/P) M_s t (H_{eff}-2\pi M_s)$, where $\alpha$ is the Gilbert damping constant, P is the spin transfer efficiency, $M_s$ is the magnetization of the free layer, t is the thickness of the free layer, $H_{eff}$ is the effective magnetic field, including the external magnetic field, the shape anisotropy field, the exchange field between the free and pinned layers and the dipole field from the pinned layer.

One design proposed to reduce $J_c$ is disclosed by Saito, in U.S. Pat. Nos. 7,239,541 B2, 7,248,497 B2 and 7,511,991 B2, which is to add an additional word line, insulated from the existing MTJ cells, by which a magnetic field is generated along the easy axis of the cells, opposite to the direction of free layer magnetization. This word line field will reduce the value of $H_{eff}$ and, therefore, will reduce $J_c$. However, this design causes the traditional "half-select" problem, in which some of the cells not intended to be programmed, but beneath the additional word line with their free layer magnetizations in an opposite direction to the word line field, can be disturbed into their opposite directions. To avoid this problem, the value of the shape anisotropy field must be increased, but this, again, raises the value of $J_c$.

One way to solve the half-select problem, not in the context of the STT scheme however, is to induce the C-switching mode ("Switching field variation in patterned submicron magnetic film elements," Youfeng Zheng, Jian-Gang Zau, J. Appl. Phys., 81(8), 15, p5471, 1997) by patterning the MTJ cells into a C-shaped horizontal cross-section, as is disclosed by Katti et al. (U.S. Pat. No. 6,798,690 B1), Ounadjela et al. (U.S. Pat. No. 6,798,691 B1), Inokuchi et al. (U.S. Pat. No. 7,394,684), Ikegawa et al. (U.S. Pat. No. 7,518,906), Kishi et al. (U.S. Pat. No. 7,599,156) and Min et al. (US Publ. Pat. Appl. 20080253178 A1), which latter published application (Min et al.) is assigned to the same assignee as the present application and whose contents are fully incorporated herein by reference. This C-switching mode approach confines the free layer field into this C-shape, whose non-coherent C-mode switching, as fully described in the references cited above, requires a much higher switching field and thereby provides immunity to disturbance by the additional word line field.

SUMMARY OF THE INVENTION

It is the object of this invention to provide a STT-MTJ cell configuration in which the critical current density is reduced, yet the half-select problem is avoided.

It is a further object of this invention to form these MTJ cells into a regular MRAM array.

It is yet a further object of this invention to provide a method of operating the array so that the first object is achieved.

This object will be met by patterning the STT-MTJ cells into a horizontal C-shape so that highly stable C-mode switching is engaged and also adding additional word lines to generate magnetic fields along the free layer easy axis that assist switching the magnetization of the free layer from the pre-programmed state to the desired state when a write current is applied.

DESCRIPTION OF THE PREFERRED EMBODIMENTS

The preferred embodiments of the present invention are N×M MRAM arrays (N and M being integers) comprising regular two-dimensional arrays of N rows of M STT MTJ cells per row, each cell being formed with a horizontal cross-section having a C-shape to provide stability against unwanted half-selection and with the arrays including additional word lines to provide pulsed magnetic fields that assist the desired C-mode magnetization switching of the cell free layers relative to their pinned layers. It is understood that each of the two preferred embodiments illustrated below refers to a regular two-dimension array of cells formed as N parallel, equally spaced rows of M cells in a row. For simplicity, the figures will all show only a 2×2 matrix of four cells.

The operation of the array proceeds as follows. A cell is selected to be written upon, for example the "m th" cell in the "n th" row. The writing process could require changing the magnetization of the cell free layer from AP (antiparallel to the pinned layer) to P (parallel to the pinned layer). Activating the proper accessing transistor allows a critical write current to flow in the proper direction (eg. down from the bit line into ground) so that the electrons first pass upward through the pinned layer and acquire spin (i.e., be polarized) in its direction of magnetization. This polarized spin then applies a torque to the magnetization of the free layer to change its magnetization to be parallel to that of the pinned layer. However, because the MTJ cell requires a C-mode change in magnetization, the torque supplied by the electrons must be assisted by the magnetic field of the word line. Therefore, a pulse of current is supplied to the word line immediately adjacent to the selected cell in a direction to produce an induced magnetic field at the position of the MTJ cell that assists the torque of the critical current. This current pulse is brief, between approximately 5 and 100 ns, and is applied a bit ahead of the write current. Since the pulsed current of the word line will also provide the same resulting pulsed magnetic field to all MTJ cells that are beneath it (the half-selected cells), we rely on the stability provided by the C-shaped cells to keep them in their pre-programmed states.

Figure 3A:
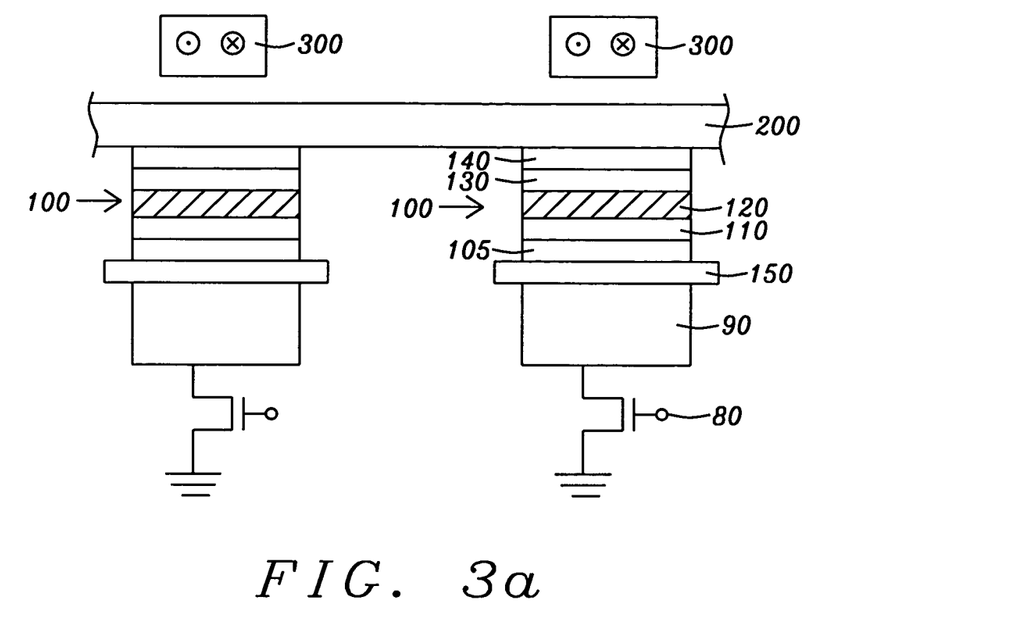
FIG. 3a is a schematic illustration of a vertical cross-sectional view of four adjacent MTJ cells formed in a STT configuration but patterned with a horizontal C-shape and positioned below additional word lines formed orthogonal to bit lines according to a first embodiment of the present invention.

Referring to schematic FIG. 3a, there is shown an MRAM configuration corresponding to a first embodiment of the present invention. The figure shows a vertical cross-sectional view of four adjacent, identical MTJ cells formed in a STT configuration and operating in accord with the STT mode of operation. Only two cells (100) can be seen because of the perspective. Each of two facing cells is positioned beneath a common current carrying line (200), the bit line. Vertically separated and insulated from the bit line and the MTJ cells, there are two word lines (300) that are directed transversely to the plane of the figure and shown in vertical cross-section. Current in the word lines can flow in either direction as shown by the circled dots (out of plane) and circled crosses (into plane), but always so as to assist the magnetization switching, as will be shown below.

Going vertically downward in either cell, there is first shown a capping layer (140) contacting the bit line and protecting the cell, beneath the capping layer there is shown a magnetically free layer (130) whose magnetic moment is free to move, beneath the free layer there is shown a dielectric tunneling barrier layer (120), which can be a layer of metallic oxide such as an oxide of aluminum, magnesium, zirconium or hafnium or their laminates, beneath the tunneling barrier layer there is shown a pinned layer (110) of fixed magnetic moment, which can be fixed by coupling to an antiferromagnetic layer (not shown, but it would be beneath the pinned layer), beneath the pinned layer there is shown a seed layer (105), on which is deposited the pinned layer, below the seed layer is shown a bottom electrode (150), which makes electrical contact with the cell, beneath the bottom electrode and in electrical contact with it, there is shown a cross-section of a stud (90) that facilitates connection to an accessing transistor (80) that is shown in a schematic circuit form as being connected to ground, to allow a current between the bit line and ground through either of the MTJ cells, if they are selected. It is further to be noted that the ferromagnetic pinned layer may be a laminated multilayer formed of two ferromagnetic layers antiferromagnetically coupled by an intervening layer of ruthenium or rhodium and then pinned by an adjacent layer of antiferromagnetic material to form a synthetic antiferromagnetic (SyAF) layer. It will be further noted below that the ferromagnetic free layer may include a nano-current-channel layer formed between separated layers of the free layer, the nano-current-channel layer composed of an oxide matrix of Al, Mg, Si, Ge, B, Zr, Ti, V or Ta or a nitride matrix of Al, B, Li, C, Si, Ge or Ti, in which the magnetic grains are formed of Co, Fe, Ni and their alloys.

Figure 3B:
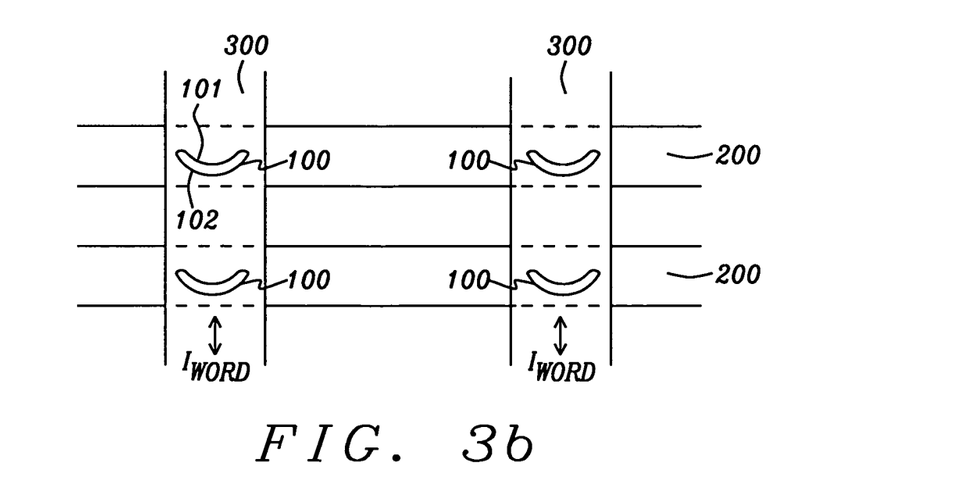
FIG. 3b is a schematic overhead view of the configuration of FIG. 3a, showing the C-shape of each of the four MTJ cells and their locations at the intersections of orthogonal bit lines and word lines.

Referring next to schematic FIG. 3b, there is shown an overhead view of the configuration of FIG. 3a. The four cells (100) are now shown in horizontal cross-section, displaying their C-shapes. As is shown in the figure, the C-shape is characterized by the intersections of a concave side (101) and a convex side (102) and has a long axis (from intersection to intersection) that is transverse to the length direction of the word line (300). The two bit lines (200) and two transversely directed word lines (300) are clearly shown and the four cells are shown positioned at their intersections with their longer axes orthogonal to the word line directions. Current in the word lines, $I_{word}$, can flow in either direction (see arrows) depending upon the necessary assist required to change the magnetization direction of the free layer as shown if FIG. 3c.

Figure 3C:
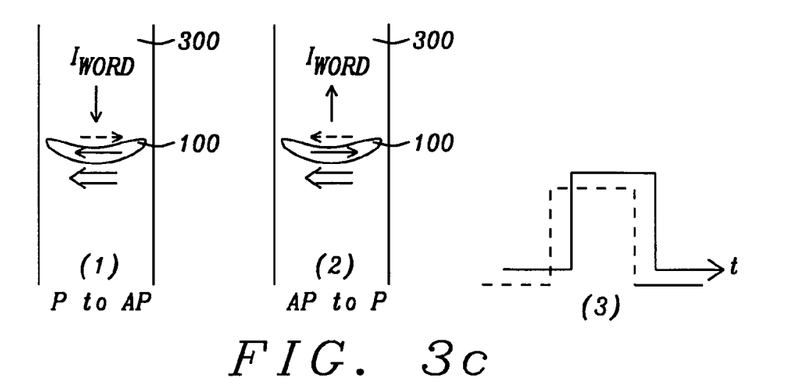
FIG. 3c shows a word-line pulsed current (shape and direction) that is required to allow the write current to exert sufficient torque to switch a free layer from parallel to anti-parallel (or vice-versa) to a pinned layer.

Referring to FIG. 3c there is shown schematically two illustrations, (1) and (2), of the overhead word line (300) of FIG. 3b and the C-shaped cell (100) beneath it. One illustration (1) shows that the direction of the word line current, $I_{word}$, required to switch the free layer magnetization of the cell from initially P (parallel to the pinned layer) to finally AP (anti-parallel to the free layer) is towards the concave side of the C-shape. The magnetization of the pinned layer is shown as a double-sided arrow beneath the cell. The single arrow in the cell is its initial free-layer magnetization, the dashed arrow outside of the cell is its final magnetization. The second illustration (2) shows that the direction of the word line current required to switch the free layer magnetization from AP (anti-parallel) to P (parallel) is towards the convex side of the C-shape. Alongside (1) is shown FIG. 3), a schematic illustration of a possible sequence (in time, t) of currents (pulsed word line current is dashed, write current is solid) that would implement the P to AP or AP to P switch. The dashed line is the pulsed word-line current that is approximately between 5 and 100 ns (nanoseconds) in duration and comes slightly before the write current (solid line) so that the write current is already capable of exerting sufficient torque to switch the magnetization.

Figure 4A:
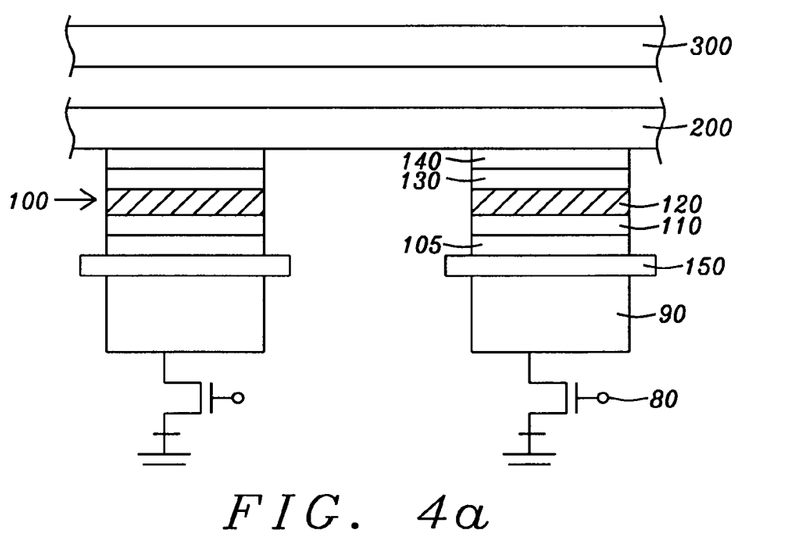
FIG. 4a is a schematic illustration of a vertical cross-sectional view of four adjacent MTJ cells formed in a STT configuration but patterned with a horizontal C-shape and positioned below additional word lines formed parallel to bit lines according to a second embodiment of the present invention.

Referring now to schematic FIG. 4a, there is shown an MRAM configuration corresponding to a second embodiment of the present invention. The figure shows a vertical cross-sectional view of four adjacent, identical MTJ cells (100) formed in a STT configuration and operating in accord with the STT mode of operation. Only two cells can be seen because of the perspective. Each of two facing cells is positioned beneath a common current carrying line (200), the bit line. Vertically separated from the bit line, and directly above it, there is shown a word line (300) that is directed parallel to the bit line. The perspective of the figure shows only one bit line and one word line, although an identical arrangement, or a multiplicity of such arrangements, as that shown could be positioned behind or in front of the illustration.

Going vertically downward in either cell, there is first shown a capping layer (140) contacting the bit line and protecting the cell, beneath the capping layer there is shown a magnetically free layer (130) whose magnetic moment is free to move, beneath the free layer there is shown a dielectric tunneling barrier layer (120), beneath the tunneling barrier layer there is shown a pinned layer (110) of fixed magnetic moment, beneath the pinned layer there is shown a seed layer (105), on which is deposited the pinned layer, below the seed layer is shown a bottom electrode (100), which makes electrical contact with the cell, beneath the bottom electrode there is shown a cross-section of a stud (90) that facilitates connection to an accessing transistor (80) and, finally, there is shown a schematic circuit of such an accessing transistor (80), connected to ground, that allows a current between the bit line and ground through either of the MTJ cells, if they are selected.

It is further to be noted that the ferromagnetic pinned layer may be a laminated multilayer formed of two ferromagnetic layers antiferromagnetically coupled by an intervening layer of ruthenium or rhodium and then pinned by an adjacent layer of antiferromagnetic material to form a synthetic antiferromagnetic (SyAF) layer.

It will be further noted below that the ferromagnetic free layer may include a nano-current-channel layer formed between separated layers of the free layer, the nano-current-channel layer composed of an oxide matrix of Al, Mg, Si, Ge, B, Zr, Ti, V or Ta or a nitride matrix of Al, B, Li, C, Si, Ge or Ti, in which the magnetic grains are formed of Co, Fe, Ni and their alloys.

Figure 4B:
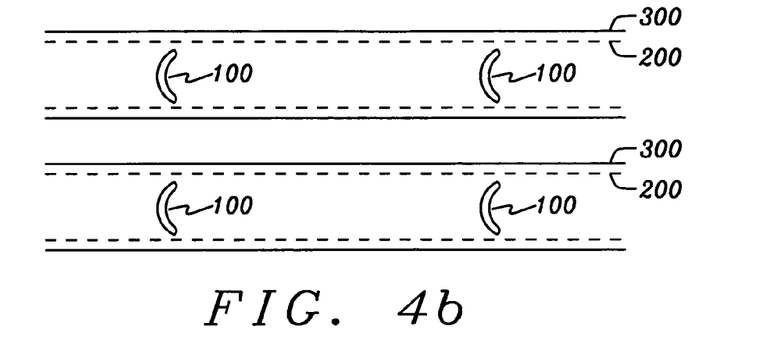
FIG. 4b is a schematic overhead view of the configuration of FIG. 4a, showing the C-shape of each of the four MTJ cells and their locations below pairs of parallel bit lines and word lines.

Referring next to schematic FIG. 4b, there is shown an overhead view of the configuration of FIG. 4a. The two bit lines (200) (shown dashed) and two word lines (300) positioned parallel to and over the bit lines are clearly shown and the four cells are shown positioned beneath them. The four cells are shown in horizontal cross-section, displaying their C-shapes and orientations relative to the word (300) and bit (200) lines. The cells are oriented with their longer axes orthogonal to the word line directions.

Figure 5A:
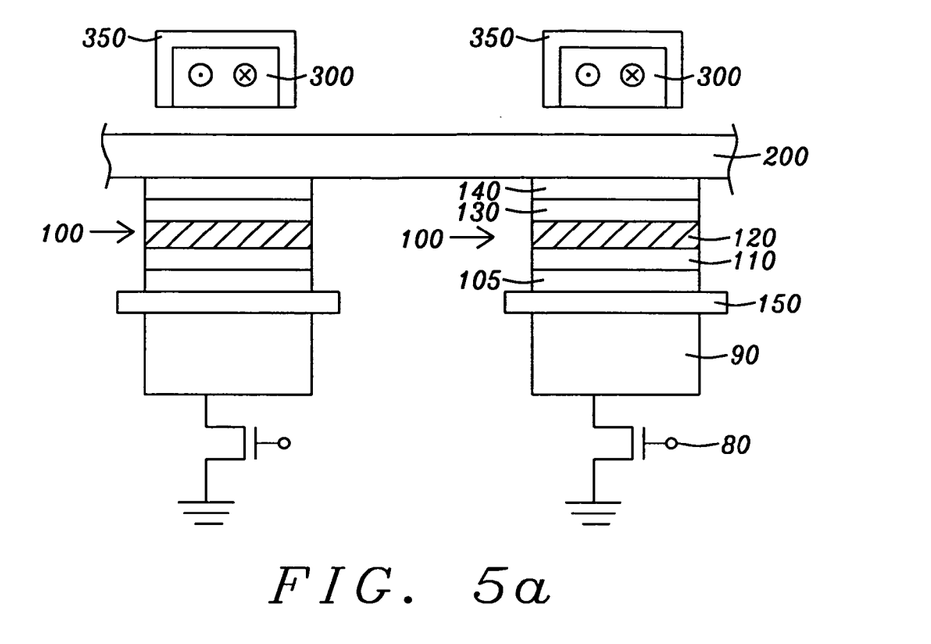
FIGS. 5a, 5b and 5c show the word line covered by magnetic cladding layers to enhance the current induced fields.
Figure 5B:
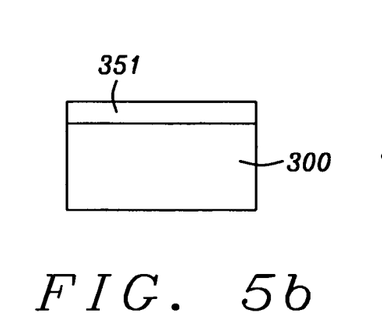
Figure 5C:
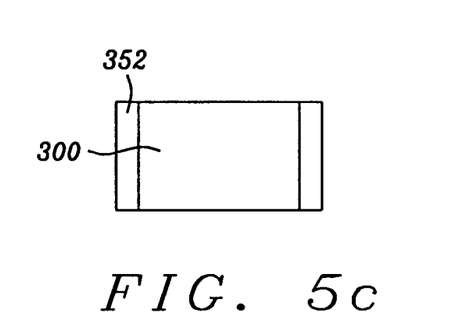

Referring next to schematic FIG. 5a, there is shown an identical configuration to that of FIG. 3a, except that the word line (300) now includes a flux concentration layer (350) that may partially surround the word line on its top and side surfaces (as shown) for the purposes of enhancing the magnetic flux in the direction of the MTJ cells. FIGS. 5b and 5c, for simplicity, show only alternative configurations of a flux enhancing layer over the word line (300) in which the concentration layer (FIG. 5b) is on an upper surface (351) only or (FIG. 5c) on side surfaces (352) only.

Figure 6:
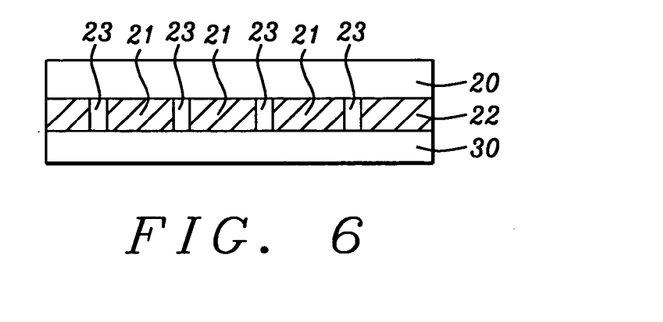
FIG. 6 shows a free layer with an interposed nano-current-channel layer.

Referring to FIG. 6, it is shown that the free layer (130) as shown in FIG. 3a or FIG. 4a, may include a nano-current channel layer (22) fabricated as a distribution (23) of the magnetic materials Co, Fe, Ni or its alloys, inside a matrix (21) formed of an insulator like an oxide or a nitride, including $Al_2O_3$, $SiO_2$, $MgO$, $ZrO_2$, $HfO_2$, ZnO, SiN, AlN and GaN. The channel layer is shown sandwiched between two ferromagnetic layers (20) and (30), to form magnetic nano-conducting channels as is illustrated schematically in the figure. The two ferromagnetic layers (20) and (30) of the free layer are exchange coupled through the magnetic nano-channels (23) in the layer (22) during storage and reading operations. During the write operation, as the writing current flows through the MTJ cell, the enhanced current density raises the temperature of the nano-channels to either be above the Curie temperature of the nano-channel material or above a critical temperature at which the nano-channels become paramagnetic or super-paramagnetic, whereby the exchange coupling between the ferromagnetic layers is switched off. This operation is discussed in co-pending application Ser. No. 12/313,708, Filing Date Nov. 24, 2008, now issued as U.S. Pat. No. 7,929,370, which is fully incorporated herein by reference.

As is finally understood by a person skilled in the art, the preferred embodiments of the present invention are illustrative of the present invention rather than limiting of the present invention. Revisions and modifications may be made to methods, materials, structures and dimensions employed in forming and providing an MRAM array of STT MTJ cells that avoid unwanted half-select writing by combining the use of an additional word line and patterning the cells with a C-shape, while still forming and providing such a device and its method of formation in accord with the spirit and scope of the present invention as defined by the appended claims.

What is claimed is:

1. An MRAM array, comprising:
a regular two-dimensional array of STT MTJ cells, formed as N parallel rows of M uniformly spaced cells;
an array of N parallel, horizontally disposed bit lines, wherein each bit line electrically contacts all M cells in one of said N rows;
an array of M parallel word lines vertically separated from said bit lines at a uniform vertical distance, wherein said word lines are orthogonal to said bit lines and wherein each of said word lines is above a row of N cells and wherein each of said word lines provides a bi-directional current and generates a pulsed magnetic field; and wherein
one of said MTJ cells is positioned at each vertical intersection of a word line and a bit line; and wherein
each MTJ cell is patterned to form a horizontal C-shaped cross-section having a longer axis that is orthogonal to the direction of said word lines; and wherein
each MTJ cell switches a magnetization direction of a free layer relative to the magnetization direction of a pinned layer in accord with C-mode switching activated by the spin torque transfer by a spin-polarized critical current generated by said bit line and passing perpendicularly through said MTJ cell in conjunction with a pulsed external magnetic field.

2. The array of claim 1 wherein a current within any of said word lines produces a magnetic field at the position of said N cells that assists in changing the magnetization direction of said free layer.

3. The array of claim 2 wherein a current in any of said bit lines can produce a current passing through a cell contacted by said bit line that is sufficient to change the magnetization of said free layer when assisted by the magnetic field produced by a word line immediately adjacent to said cell.

4. The array of claim 1 wherein the magnetic field of a word line immediately adjacent to a cell cannot switch the magnetization of said cell unless a current is passing through said cell.

5. The array of claim 3 wherein said current in said word line is a pulsed current having a duration between approximately 5 and 100 seconds and beginning before said current in said bit line.

6. The array of claim 5 wherein said current in said word line will assist in switching the magnetization of said free layer from parallel to said pinned layer to anti-parallel to said pinned layer if it is directed towards a concave side of said C-shaped cell and will assist in switching the magnetization of said free layer from anti-parallel to said pinned layer to parallel to said pinned layer if it is directed towards a convex side of said C-shaped cell.

7. The array of claim 1 wherein said horizontally C-shaped STT MTJ cell comprises:
a capping layer;
a magnetically free layer formed beneath said capping layer;
a tunneling barrier layer formed beneath said magnetically free layer;
a magnetically pinned layer formed beneath said tunneling barrier layer;
an electrode electrically contacting said magnetically pinned layer; and
an accessing transistor electrically contacting said electrode and providing an electrical pathway to ground.

8. The array of claim 1 wherein each of said word lines is partially clad by a layer of magnetic material to concentrate the magnetic flux produced by said word lines in a direction towards said MTJ cells.

9. The array of claim 7 wherein said magnetically free layer is a laminate of ferromagnetic layers exchange coupled through a nano-current-channel layer.

10. The array of claim 9 wherein said nano-current-channel layer is a matrix of oxide of Al, Mg, Si, Ge, B, Zr, Ti, V or Ta or a nitride matrix of Al, B, Li, C, Si, Ge or Ti, which is formed magnetic particles of Co, Fe or Ni or their alloys.

11. The array of claim 7 wherein said tunneling barrier layer is a layer of oxide of aluminum, or magnesium, or zirconium or hafnium or of laminates of these oxides.

* * * * *